United States Patent
Yokoo

(10) Patent No.: US 7,294,983 B2
(45) Date of Patent: Nov. 13, 2007

(54) MOTOR DRIVE CIRCUIT

(75) Inventor: Satoshi Yokoo, Ota (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 11/514,194

(22) Filed: Sep. 1, 2006

(65) Prior Publication Data
US 2007/0057704 A1    Mar. 15, 2007

(30) Foreign Application Priority Data
Sep. 6, 2005    (JP)    ............................. 2005-257785

(51) Int. Cl.
*H03K 17/687*    (2006.01)
(52) U.S. Cl. ................. 318/293; 327/423; 327/433; 307/127
(58) Field of Classification Search ............... 318/280, 318/291, 293, 294, 432, 433; 327/108–112, 327/423, 424, 433, 434; 307/127, 129–131
See application file for complete search history.

(56) References Cited

U.S. PATENT DOCUMENTS

| | | | | |
|---|---|---|---|---|
| 5,469,096 A | * | 11/1995 | Nessi et al. .................. | 327/112 |
| 5,565,715 A | * | 10/1996 | Doluca ........................ | 307/130 |
| 5,614,797 A | * | 3/1997 | Carobolante ................ | 318/432 |
| 5,708,578 A | * | 1/1998 | Stoddard et al. .............. | 363/98 |
| 6,198,335 B1 | * | 3/2001 | Pakriswamy ................ | 327/423 |
| 6,400,190 B1 | * | 6/2002 | Lacombe .................... | 327/110 |

\* cited by examiner

*Primary Examiner*—Bentsu Ro
(74) *Attorney, Agent, or Firm*—Oliff & Berridge, PLC

(57) ABSTRACT

Two systems consisting of an on-off control section corresponding to the saturation drive system and a constant voltage control section corresponding to the constant voltage drive system are provided as a circuit for controlling the conduction state of a transistor $QP_{11}$ provided at the output section. The constant voltage unit comprises an operational amplifier $A_1$, which monitors the output voltage Vout and feedback-controls the gate voltage of $QP_{11}$. On the other hand, the on-off control section delivers a control signal for turning on and off $QP_{11}$ corresponding to an input signal input to IN-U through inverters 40 and 42. Switches 46 and 48 for selectively applying the output from the control unit of either one of these two systems are provided to select the switch to be turned on based on a mode signal input to SW. This configuration enables the realization of different drive systems and restricts increase in circuit size while commonly using the output unit configured with comparatively large transistors. In addition, since the saturation drive system can be realized without depending on feedback control, high control responsiveness is secured to appropriately perform operation at high frequencies such as switching operations by PWM control.

6 Claims, 7 Drawing Sheets

(related art)

US 7,294,983 B2

MOTOR DRIVE CIRCUIT

CROSS-REFERENCE TO RELATED APPLICATIONS

The priority application number JP2005-257785 upon which this patent application is based is hereby incorporated by reference.

BACKGROUND OF THE INVENTION

1. Field of the Invention

The invention relates to a motor drive circuit for supplying voltage and electric current for driving a motor, and more specifically a motor drive circuit capable of preferably serving for switching of a motor drive system.

2. Background of the Invention

FIG. 1 is a schematic circuit diagram showing the configuration of a DC motor and a motor driver (motor drive circuit) for supplying electric current to the motor in order to drive it. An output terminal of the motor driver 2 is connected to a terminal of the DC motor 4. When a control unit 6 turns on a field effect transistor (FET) 8 between the output terminal and the power supply Vdd and turns off an FET 10 between the output terminal and ground, electric current flows from Vdd to the ground connected to another terminal of the motor 4 passing through the motor 4 to drive the motor 4. In addition, when the FET 8 is turned off and the FET 10 is turned on in the condition where the motor 4 is in operation, the counter-electromotive force generated by the rotation of the motor 4 is absorbed by the ground in the form of an electric current, enabling the braking of rotation.

The rotating direction of a DC motor can be switched by changing the direction of the electric current. FIG. 2 is a schematic circuit diagram showing the configuration of a motor driver capable of switching the rotating direction. This is an H-bridge configuration in which motor drivers 2a and 2b corresponding to the motor driver 2 shown in FIG. 1 are connected to both ends of the motor 4. In the circuit shown in FIG. 2, the direction of the electric current flowing through the motor 4 can be changed by changing the combination of on and off for FETs 8a and 10a of the motor driver 2a and FETs 8b and 10b of the motor driver 2b. More specifically, the direction of the electric current when the FETs 8a and 10b are turned on is different from that when the FETs 8b and 10a are turned on, thus enabling a change in the rotating direction of the motor 4.

Major motor drive systems using the motor driver 2, 2a and 2b are the saturation drive, the constant voltage drive and the constant current drive. FIGS. 3 through 5 are circuit diagrams showing configurations of the conventional motor driver 2 in each drive system. In these FIGS. 3 through 5, common components are provided with identical symbols to simplify descriptions. Hereafter symbols "$QP_k$" (k=1, 2, 3, . . . ) denote a metal oxide semiconductor field effect transistor (MOSFET) of the P channel type and symbols "$QN_k$" (k=1, 2, 3, . . . ) denote a MOSFET of the N channel type. In either of these circuits, an entry of L (Low) level into the terminal IN-U turns on $QP_1$ between Vdd and the output terminal OUT and, on the other hand, an entry of H (High) level into the IN-U turns off $QP_1$. Moreover, an entry of L level into IN-L turns on $QN_1$ between ground and the output terminal OUT and, conversely, an entry of H level turns off $QN_1$. Each system is described below.

Firstly, FIG. 3 shows a circuit configuration of a motor driver using the saturation drive system. The pairs of $QP_2$ and $QN_2$, $QP_3$ and $QN_3$ and $QP_4$ and $QN_4$ configure inverters 20, 22 and 24 respectively, invert the input level commonly received by each gate and deliver the inverted level from the connecting points between the drains of each transistor configuring each pair. The inverters 20 and 24 are arranged in series. The input level of IN-U is input to the inverter 20, inverted twice and applied from the output terminal of the inverter 24 to the gate of $QP_1$. The input level of In-U is inverted by the inverter 22 and applied to the gate of $QN_1$.

When IN-U and IN-L are at the L and H levels respectively, $QP_1$ and $QN_1$ are turned on and off respectively and the output voltage Vout corresponding to the power supply Vdd connected to the source of $QP_1$ is obtained from the output terminal OUT. On the other hand, when IN-U and IN-L are at the H and L levels respectively, $QP_1$ and $QN_1$ are turned off and on respectively and the output voltage Vout corresponding to the ground connected to the source of $QN_1$ is obtained from the output terminal OUT.

In the saturation drive system, Vout is set corresponding to the power supply Vdd supplied to the motor driver and the ground potential in this manner. For example, the saturation drive system is used for controlling PWM (pulse width modulation).

FIG. 4 shows a circuit configuration using the constant voltage drive system. This circuit is different from that shown in FIG. 3 in the configuration of the control unit for $QP_1$, which is controlled corresponding to the output of an operational amplifier $A_1$. A switch 26 consisting of the pair of $QP_5$ and $QN_5$ is provided between the output terminal of the operational amplifier $A_1$ and the gate of $QP_1$. The turning on and off of the switch 26 is controlled according to each gate voltage of $QP_5$ and $QN_5$. More specifically, the gate of $QP_5$ is connected to IN-U and the gate of $QN_5$ is connected to the output terminal of an inverter 20, so that when IN-U is at the L level, the switch 26 is turned on and, on the contrary, when IN-U is at the H level, the switch 26 is turned off.

Resistors Rf and Rg are arranged between the output terminal OUT and ground in series, and voltage Va1 at the connecting point of Rf and Rg is used as one input signal of the operational amplifier $A_1$. Va1 is expressed as the equation:

$$Va1 = Vout \cdot Rg/(Rf+Rg) \quad (1)$$

where Vout is a voltage of the output terminal OUT.

The description of the configuration of $QP_1$ is now finished. The configuration of $QN_1$ is similar to that of the saturation drive system shown in FIG. 3. In this circuit configuration, when IN-U and IN-L are at the L and H levels respectively, the switch 26 is turned on to turn on and off $QP_1$ and $QN_1$ respectively. At this time, the operational amplifier $A_1$ controls the conduction state of $QP_1$ so that the voltage Va1 input to one input terminal is equal to the reference voltage Vref input to the other input terminal. As a result, the output voltage Vout is set at a constant voltage in proportion to Vref as shown in the following equation:

$$Vout = Vref \cdot (Rf+Rg)/Rg \quad (2)$$

FIG. 5 shows a circuit configuration using the constant current drive system. This circuit is different from that shown in FIG. 3 in the configuration of the control unit for $QN_1$, which is controlled corresponding to the output of an operational amplifier $A_2$. A switch 28 consisting of the pair of $QP_6$ and $QN_6$ is provided between the output of the operational amplifier $A_2$ and the gate of $QN_1$. The turning on and off of the switch 28 is controlled according to each gate voltage of $QP_6$ and $QN_6$. More specifically, the gate of $QP_6$ is connected to IN-L and the gate of $QN_6$ is connected to the output terminal of an inverter 22 so that when IN-L is at the L level, the switch 28 is turned on and, on the contrary, when IN-L is at the H level, the switch 28 is turned off.

A resistor Rt is arranged between the source of $QN_1$ and ground in series and the voltage Va2 at the connecting point of $QN_1$ and Rt is input to another input terminal of an operational amplifier $A_2$. Va2 is expressed as the equation:

$$Va2=Ids \cdot Rt \tag{3}$$

where Ids is an electric current flowing between the drain and the source of $QN_1$.

The description of the configuration of $QN_1$ is now finished. The configuration of $QP_1$ is similar to that of the saturation drive system shown in FIG. 3. In this circuit configuration, when IN-U and IN-L are at the H and L levels respectively, the switch 28 is turned on to turn on and off $QN_1$ and $QP_1$ respectively so that the electric current Iout flowing to the output terminal OUT becomes Ids. At this time, the operational amplifier $A_2$ controls the conduction state of $QN_1$ so that the voltage Va2 input to one input terminal is equal to the reference voltage Vref input to the other input terminal. As a result, the output current Iout of a motor driver using the constant current system is set at a constant current in proportion to Vref as shown in the following equation:

$$Iout=Vref/Rt \tag{4}$$

In the circuit shown in FIG. 5, Iout serves to introduce electric current from the terminal OUT. For example, in the configuration shown in FIG. 2 that is adopted using the motor driver shown in FIG. 5, when IN-U and IN-L are at the H and L levels respectively in one motor driver 2a, the motor driver 2a serves to introduce a constant current Iout. At this time, when IN-U and IN-L are made to be at the L and H levels respectively in another motor driver 2b to turn on $QP_1$, and the constant current Iout flows from Vdd of the motor driver 2b to ground of the motor driver 2a through the motor 4 to drive the motor 4.

Among these multiple drive systems, there is a need to drive a motor by switching between the constant voltage drive and the saturation drive or to drive a motor by switching between the constant current drive and the saturation drive. On the other hand, there is a problem in the conventional method in that the circuit size of a motor driver is large because motor drivers required for each drive system are provided as independent circuits.

In the motor driver using the saturation drive system shown in FIG. 3, the output voltage is fixed by Vdd and the ground potential, through being disabled in order to set the constant voltage Vout at the desired value between them. In addition, the desired constant current Iout can also not be obtained. On the other hand, in the motor driver using a constant voltage drive system shown in FIG. 4 and the motor driver using a constant current drive system shown in FIG. 5, the configuration of the variable Vref enables the setting of Vout at a value similar to the output voltage of the saturation drive system. Motor drivers using such constant voltage or constant current drive systems, however, have low control responsiveness because feedback control is applied using an operational amplifier. Thus there is a problem where these motor drivers are not suitable for switching operations at required frequencies, such as in PWM control.

SUMMARY OF THE INVENTION

The invention provides a motor drive circuit capable of being used in multiple drive systems while keeping circuit size compact.

The motor drive circuit according to the invention is comprised of an output unit that has a first drive transistor for controlling continuity between a first power supply and a drive output terminal and a second drive transistor for controlling continuity between a second power supply and the drive output terminal and performs power supply from the drive output terminal to a motor according to conditions of the first drive transistor and the second drive transistor, a first control unit that turns on and off the first drive transistor corresponding to a first switching signal and delivers voltage corresponding to the first power supply from the drive output terminal in a conduction state of the first drive transistor and a second control unit that controls the action of the second drive transistor corresponding to a second switching signal and a mode signal.

The aforementioned second control unit is comprised an on-off control section that selectively delivers on-voltage for making the second drive transistor be in a conduction state and off-voltage for making it be in a cut-off state corresponding to the second switching signal, a constant voltage control section that generates a conduction control signal to be input to the control terminal of the second drive transistor based on the voltage of the drive output terminal set at the required target voltage and a switching section that selects either the on-voltage delivered by the on-off control section or the output from the constant voltage control section to deliver the output to the second drive transistor as the conduction control signal corresponding to the mode signal when putting the second drive transistor in the conduction state.

The switching section selects the on-voltage of the on-off control section as the conduction control signal to deliver voltage corresponding to the second power supply from the drive output terminal when the mode signal corresponds to a saturation output mode and selects the output of the constant voltage control section as the conduction control signal to set the voltage of the drive output terminal at the target voltage when the mode signal corresponds to a constant voltage output mode.

In another motor drive circuit according to the invention, the second control unit is comprised of an on-off control section that selectively delivers on-voltage for making the second drive transistor be in a conduction state and off-voltage for making it to be in a cut-off state corresponding to the second switching signal, a constant current control section that generates a conduction control signal to be input to the control terminal of the second drive transistor based on the electric current flowing in the drive output terminal set at a required target current and a switching section that selects either the on-voltage delivered by the on-off control section or the output from the constant current control section to deliver the output to the second drive transistor as the conduction control signal corresponding to the mode signal when putting the second drive transistor in the conduction state.

The switching section of this second control unit selects the on-voltage of the on-off control section as the conduction control signal to deliver a voltage corresponding to the second power supply from the drive output terminal when the mode signal corresponds to a saturation output mode and selects the output of the constant current control section as the conduction control signal to set the current flow in the drive output terminal at the target current when the mode signal corresponds to a constant current output mode.

DESCRIPTION OF THE PREFERRED EMBODIMENTS

Embodiments according to the invention are described based on drawings.

First Embodiment

Figure 1:
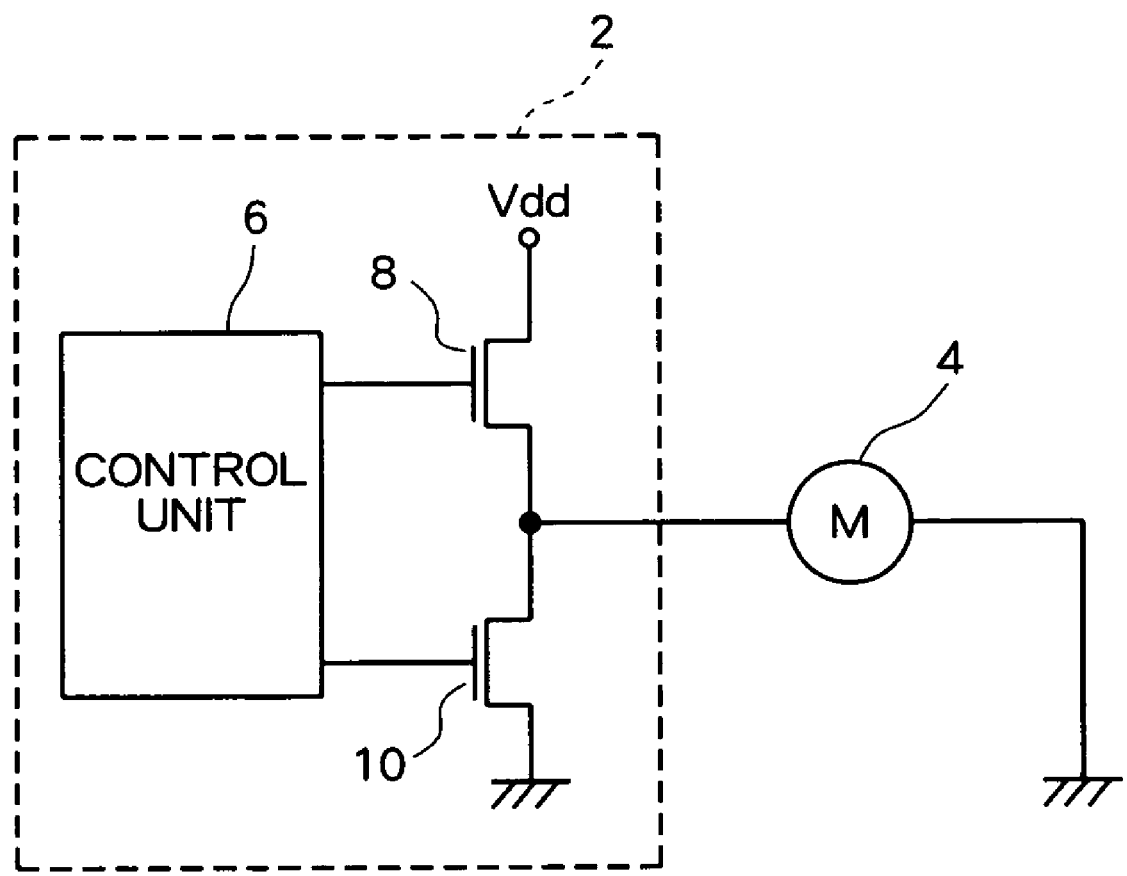
FIG. 1 is a schematic circuit diagram showing a motor driver for supplying electric current to and driving a DC motor and a motor concerned.
Figure 2:
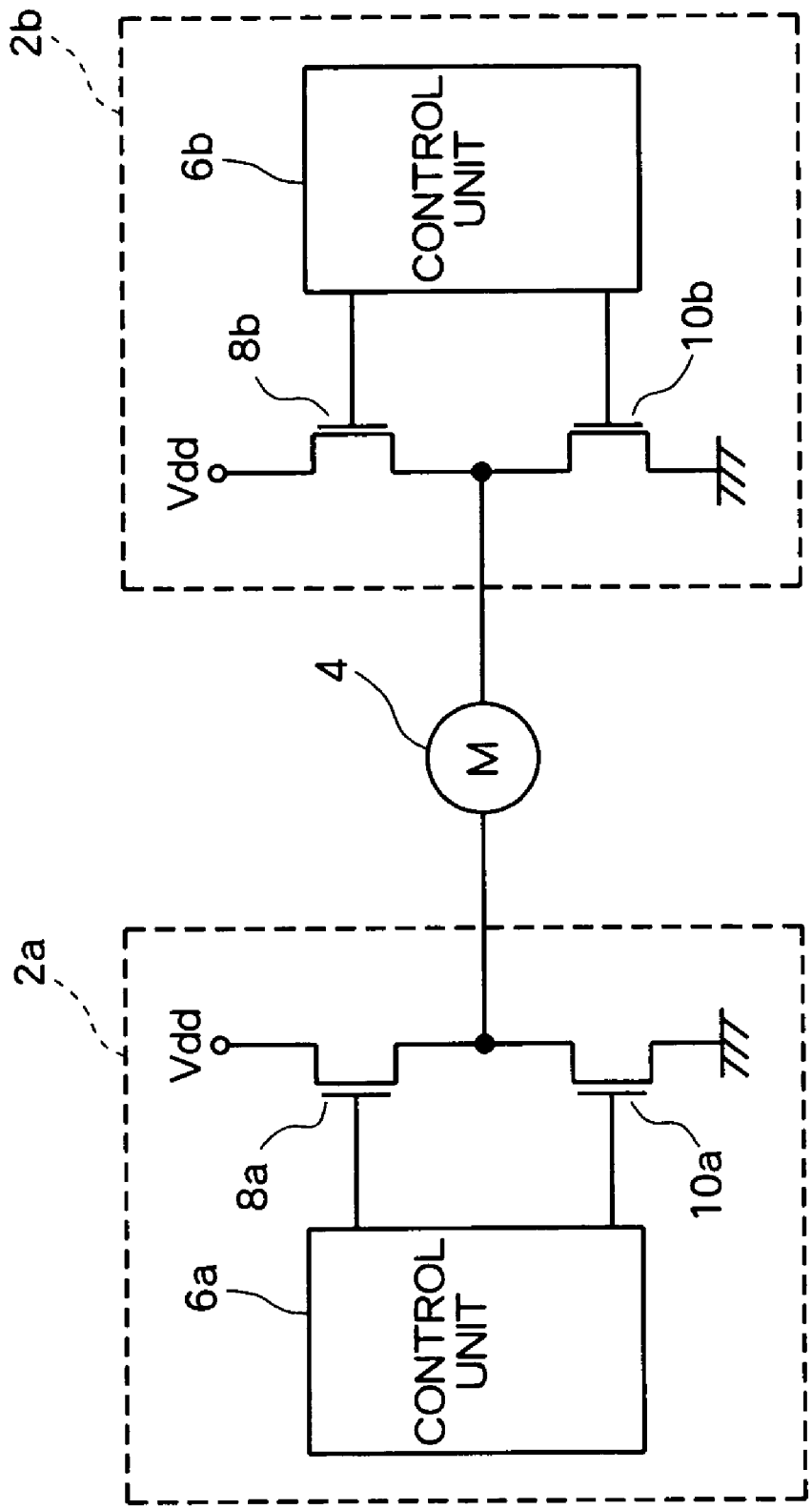
FIG. 2 a schematic circuit diagram showing the configuration of a motor driver capable of switching rotating direction.
Figure 3:
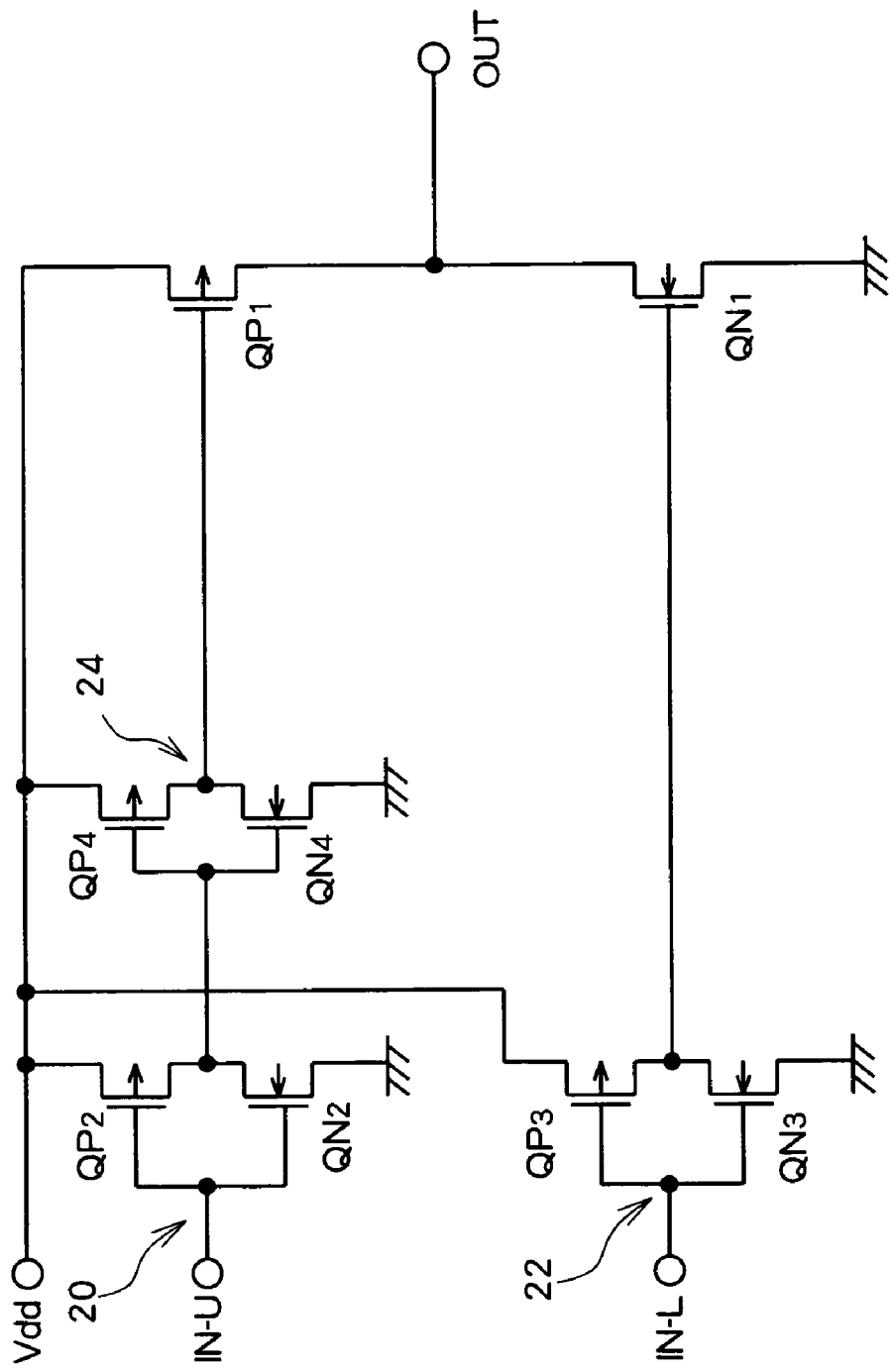
FIG. 3 is a circuit diagram showing the configuration of a conventional motor driver using a saturation drive system.
Figure 4:
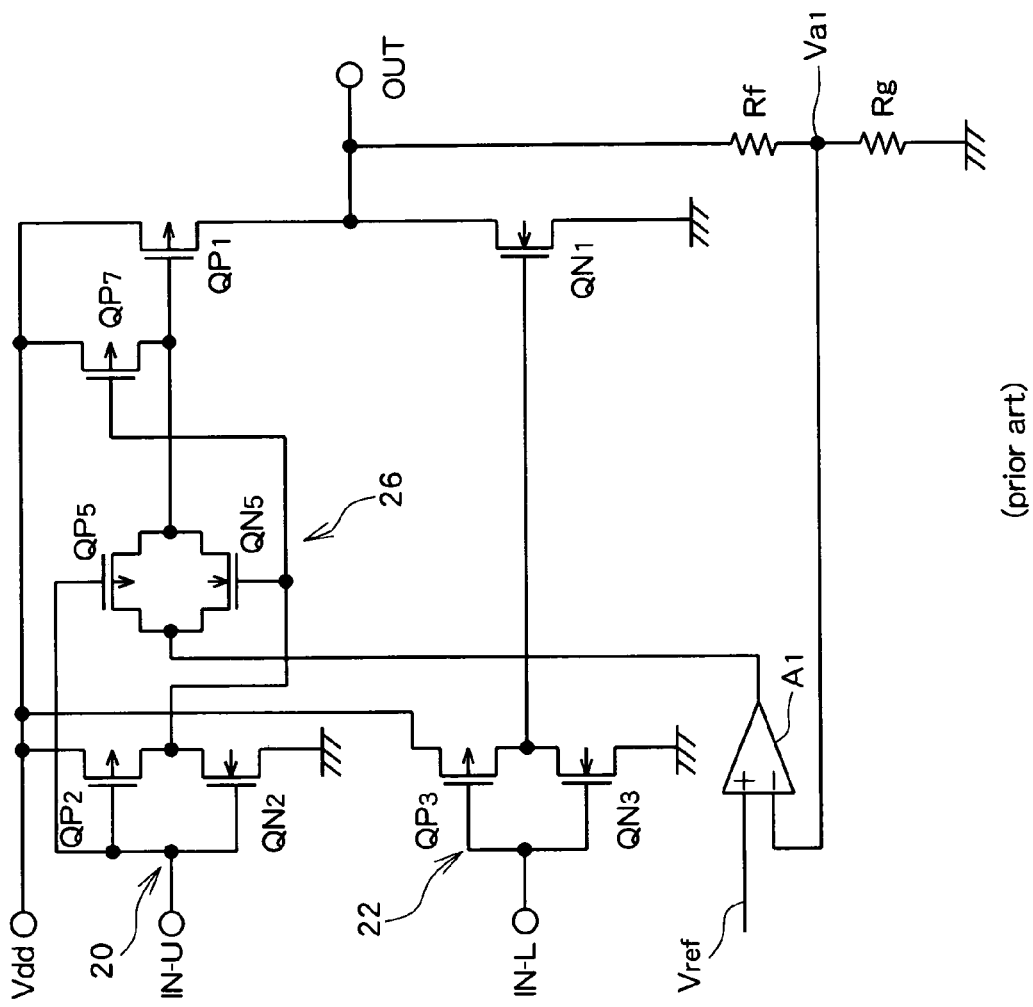
FIG. 4 is a circuit diagram showing a configuration of a conventional motor driver using a constant voltage drive system.
Figure 5:
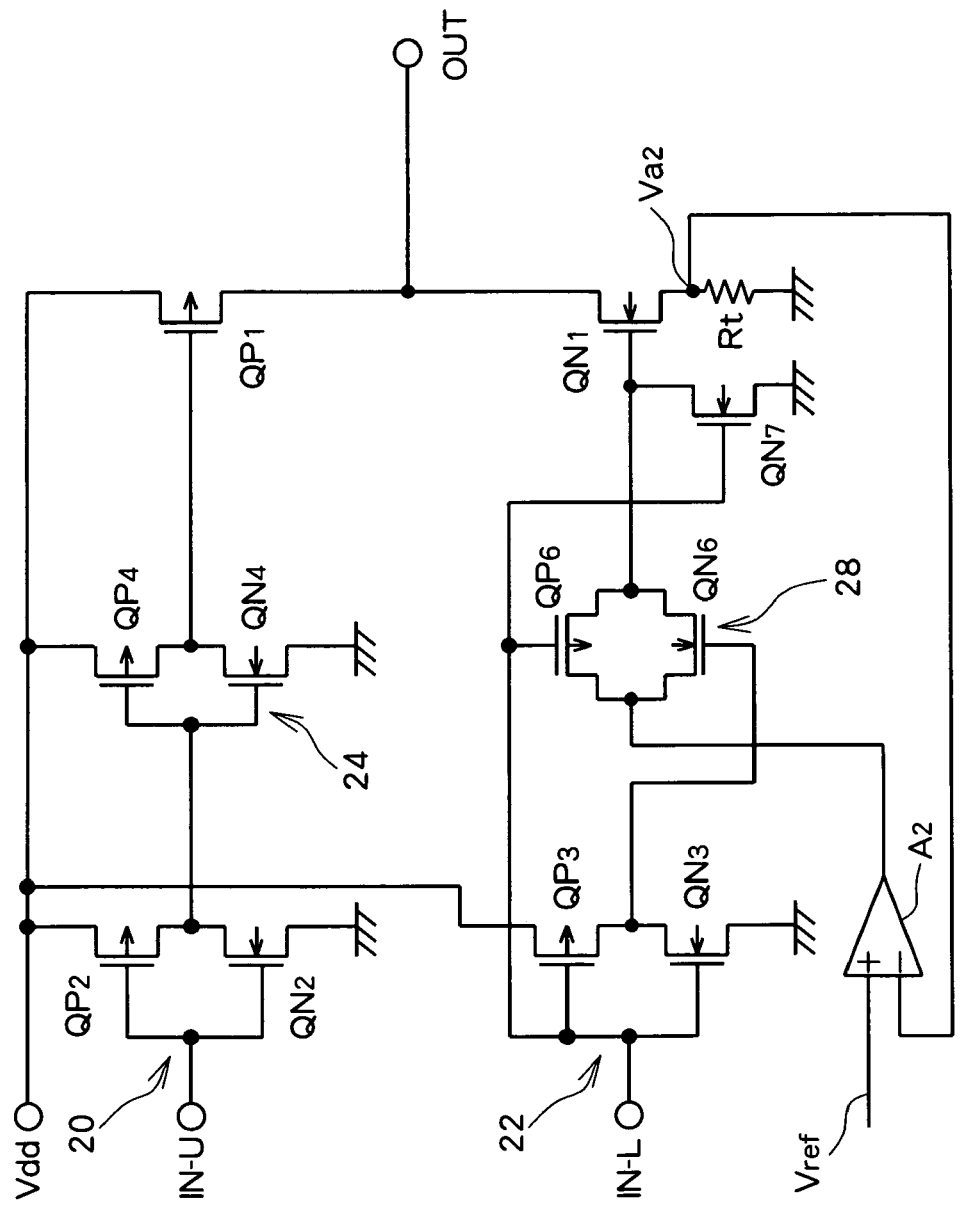
FIG. 5 is a circuit diagram showing a configuration of a conventional motor driver using a constant current drive system.
Figure 6:
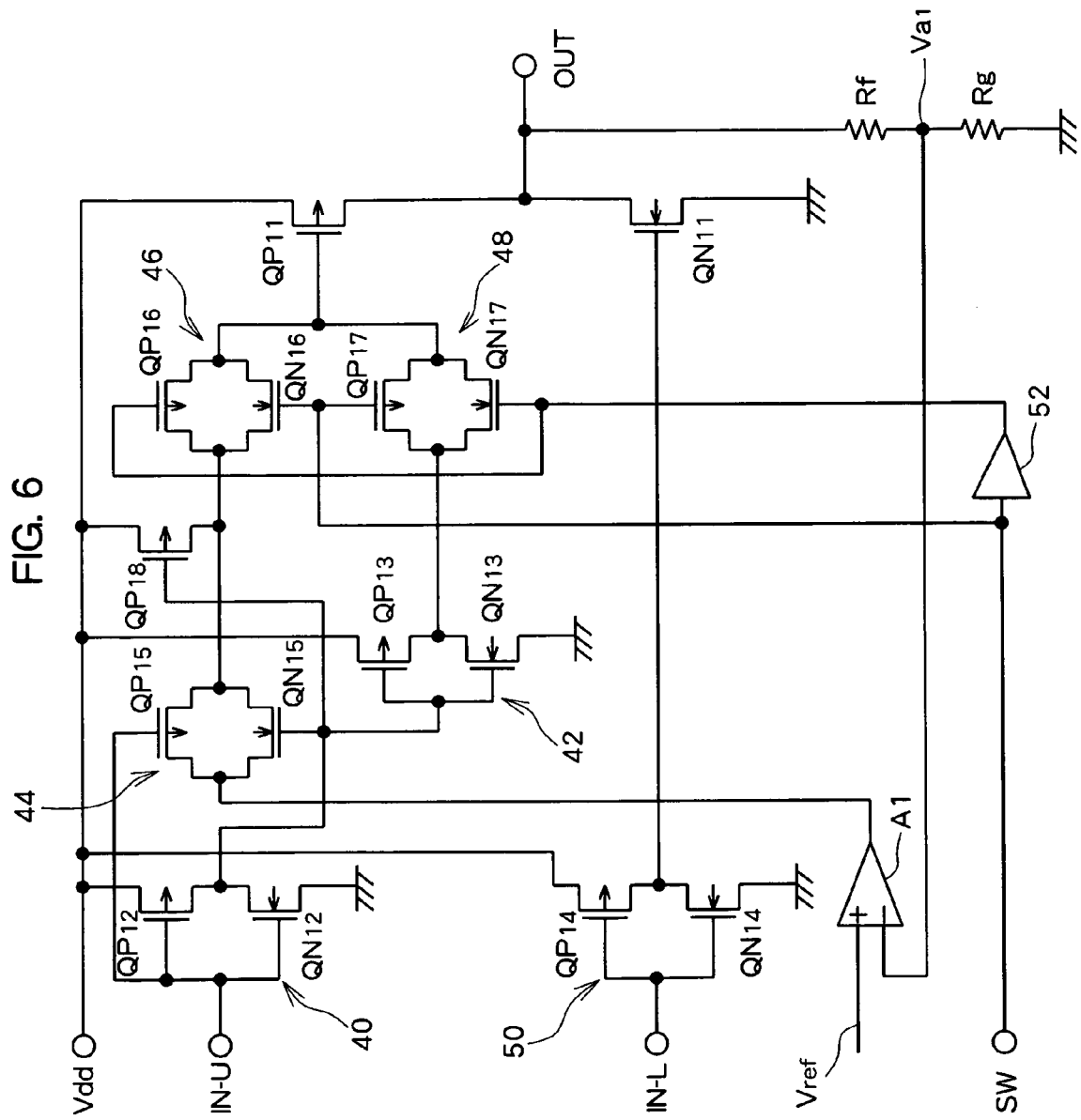
FIG. 6 is a circuit diagram showing a general configuration of a motor driver relating to a first embodiment according to the invention.

FIG. 6 is a circuit diagram showing the general configuration of a motor driver relating to the first embodiment. The motor driver shown in FIG. 6 corresponds to the motor driver 2 shown in FIG. 1 or the motor drivers 2a and 2b shown in FIG. 2 and supplies electric current from an output terminal OUT to the motor 4 to drive the motor 4. The motor driver has a configuration capable of switching between the constant voltage drive and the saturation drive. The motor driver has $QP_{11}$ and $QN_{11}$ at an output section thereof. A source of $QP_{11}$ is connected to Vdd, a drain thereof is connected to the output terminal OUT, and their actions are controlled by a control circuit connected to a gate. A drain of $QN_{11}$ is connected to the output terminal OUT, a source thereof is connected to ground and their actions are controlled by a control circuit connected to the gate.

The control circuit of $QP_{11}$ is configured with inverters 40 and 42, switches 44, 46 and 48 as well as an operational amplifier $A_1$. On the other hand, the control circuit of $QN_{11}$ is configured with an inverter 50.

Each of the inverters 40, 42 and 50 are configured with a P channel FET (P-ch FET) and an N channel FET (N-ch FET), the source of the P-ch FET is connected to Vdd and the source of the N-ch FET is connected to the ground. The gates of the P-ch FET and N-ch FET are connected to each other to configure the input terminal of the inverter. On the other hand, the drains of the P-ch FET and N-ch FET are connected to each other to configure the output terminal of the inverter. More specifically, the inverter 40 is configured with the pair of $QP_{12}$ and $QN_{12}$, the inverter 42 with the pair of $QP_{13}$ and $QN_{13}$ and the inverter 50 with the pair of $QP_{14}$ and $QN_{14}$.

Each of the switches 44, 46 and 48 are configured with a pair of P-ch FET and N-ch FET. The drains of both FETs are connected to each other and the sources of both FETs are connected to each other. For example, the drains connected to each other and the sources connected to each other are used as an input terminal of the switch and an output terminal of the switch respectively. The turning on and off of each switch is controlled by a signal applied to the gates of both FETs configuring the switch. More specifically, the switch 44 is configured with a pair of $QP_{15}$ and $QN_{15}$, the switch 46 with a pair of $QP_{16}$ and $QN_{16}$ and the switch 48 with a pair of $QP_{17}$ and $QN_{17}$.

A control circuit of $QP_{11}$ is configured with an on-off control section containing the inverters 40 and 42 to realize the saturation drive, a constant voltage control section containing the inverter 40 and an operational amplifier $A_1$ to realize the constant voltage drive and a switching section for switching between them. The switching section is configured with the switches 44, 46 and 48.

A switching signal for switching the operating state of $QP_{11}$ is input to the terminal IN-U. The inverter 40 inverts and sends out the switching signal input to the input terminal IN-U. The inverter 42, configures the on-off control section, further inverting the output of the inverter 40 to input it to the switch 48.

On the other hand, the reference voltage Vref is input to one input terminal of the operational amplifier $A_1$ in the constant voltage control section. Resistors Rf and Rg are arranged between the output terminal OUT and the ground in series and voltage Va1 at the connecting point of Rf and Rg is input to another input terminal of the operational amplifier $A_1$. Va1 is expressed as the aforementioned equation (1), namely:

$$Va1 = Vout \cdot Rg/(Rf+Rg) \qquad (1)$$

where Vout is a voltage of the output terminal OUT. An output of the operational amplifier $A_1$ is input to the switch 44.

In the switch 44, an input signal to IN-U is applied to the gate of $QP_{15}$ and an output of the inverter 40 is applied to the gate of $QN_{15}$. The switch 44 is turned on when IN-U is at the L level and, on the contrary, turned off when IN-U is at the H level. On the other hand, the switches 46 and 48 are controlled by a mode signal input to a terminal SW. This mode signal is set at the L level when a saturation drive mode is specified, and set at the H level when a constant voltage mode specified. A mode signal input to the input terminal SW is directly applied to the gate of $QN_{16}$ in the switch 46 and inverted by an inverter 52 and applied to the gate of $QP_{16}$. In the switch 48, the mode signal inverted by the inverter 52 is applied to the gate of $QN_{17}$ and the mode signal is applied to the gate of $QP_{17}$ as it is. That is to say, the switches 46 and 48 act complementarily, thus one of the two switches is turned on and the other switch is turned off according to the mode signal. More specifically, when the mode signal input to the terminal SW is at the L level, the switch 48 is turned on and the output of the inverter 42 configuring the on-off control section is applied to the gate of $QP_{11}$. Moreover, when the mode signal is at the H level, the switch 46 is turned on. At this time, if the switch 44 is also in an on state, the output of the operational amplifier $A_1$ configuring the constant voltage control section is applied to the gate of $QP_{11}$.

A control circuit of $QN_{11}$ is configured with an inverter 50. A switching signal for switching the operating state of $QN_{11}$ is input to a terminal IN-L and the inverter 50 inverts the switching signal input to the input terminal IN-L and applies it to the gate of $QN_{11}$.

As mentioned above, each control circuit for $QP_{11}$ and $QN_{11}$ is configured. The action of $QP_{11}$ is controlled based on the switching signal input to IN-U and the mode signal input to the terminal SW, while on the other hand, the action of $QN_{11}$ is controlled based on the switching signal input to IN-L.

When operating the motor driver using the saturation drive system, SW should be at the L level. In this condition the switches 48 and 46 are turned on and off respectively. When IN-U and IN-L are at the L and H levels respectively while keeping SW at the L level, the L level delivered by the inverter 42 is applied to the gate of $QP_{11}$ to turn on $QP_{11}$ and the L level delivered by the inverter 50 is applied to the gate of $QN_{11}$ to turn off $QN_{11}$. An output voltage Vout corresponding to the power supply Vdd connected to the drain of $QP_{11}$ is obtained from the output terminal OUT. Additionally, in this case, although the switch 44 is turned on, an output of the operational amplifier $A_1$ does not affect the performance of $QP_{11}$ because the downstream switch 46 is in an off state.

When IN-U and IN-L are at the H and L levels respectively while keeping SW at the L level, the H level delivered by the inverter 42 is applied to the gate of $QP_{11}$ to turn off $QP_{11}$ and the H level delivered by the inverter 50 is applied to the gate of $QN_{11}$ to turn on $QN_{11}$. The output voltage Vout corresponding to the ground connected to the source of $QN_{11}$ is obtained from the output terminal OUT. Therefore, the saturation drive enables the generation of a pulse with a height corresponding to the voltage difference between the power supply Vdd supplied to the motor driver and ground by switching between IN-U and IN-L.

When operating the motor driver in the constant voltage drive, SW should be at the H level. When IN-U and IN-L are at the L and H levels respectively while keeping SW at the H level, the switches 44 and 46 are turned on and the switch 48 is turned off. An output of the operational amplifier $A_1$ is applied to the gate of $QP_{11}$ to turn on $QP_{11}$ and the L level delivered by the inverter 50 is applied to the gate of $QN_{11}$ to turn off $QN_{11}$. Here the operational amplifier $A_1$ controls the conduction state of $QP_{11}$ so that the voltage Va1 input to one input terminal is equal to the reference voltage Vref input to the other input terminal. As a result, the output voltage Vout in this condition is set at a constant voltage corresponding to Vref as expressed by the aforementioned equation (2), namely:

$$Vout = Vref(Rf+Rg)/Rg \quad (2)$$

When IN-U and IN-L are at the H and L levels respectively while keeping SW at the H level, the gate of $QP_{18}$ receives the output of the inverter 40 and is turned on to enter Vdd to be applied to the source in the switch 46. Thus Vdd delivered by the switch 46, namely the H level, is applied to the gate of $QP_{11}$ to turn off $QP_{11}$. On the other hand, $QN_{11}$ is turned on and the output voltage Vout corresponding to the ground connected to the source of $QN_{11}$ is obtained from the output terminal OUT. Additionally, since IN-U is at the H level, the switch 44 is in an off state and it is impossible for the output of the operational amplifier $A_1$ to make $QP_{11}$ to be in a conduction state.

In the above-mentioned configuration, although the switches 44 and 46 are arranged between the output terminal of the operational amplifier $A_1$ and the gate of $QP_{11}$ in series, it is possible to configure without the switch 44. In this configuration, when turning on $QN_{11}$, SW is set at the L level in addition to setting IN-U and IN-L to the H and L levels respectively. Since the switch 46 is kept in an off state, this prevents the output of the operational amplifier $A_1$ making $QP_{11}$ be in a conduction state without the switch 44.

Second Embodiment

Figure 7:
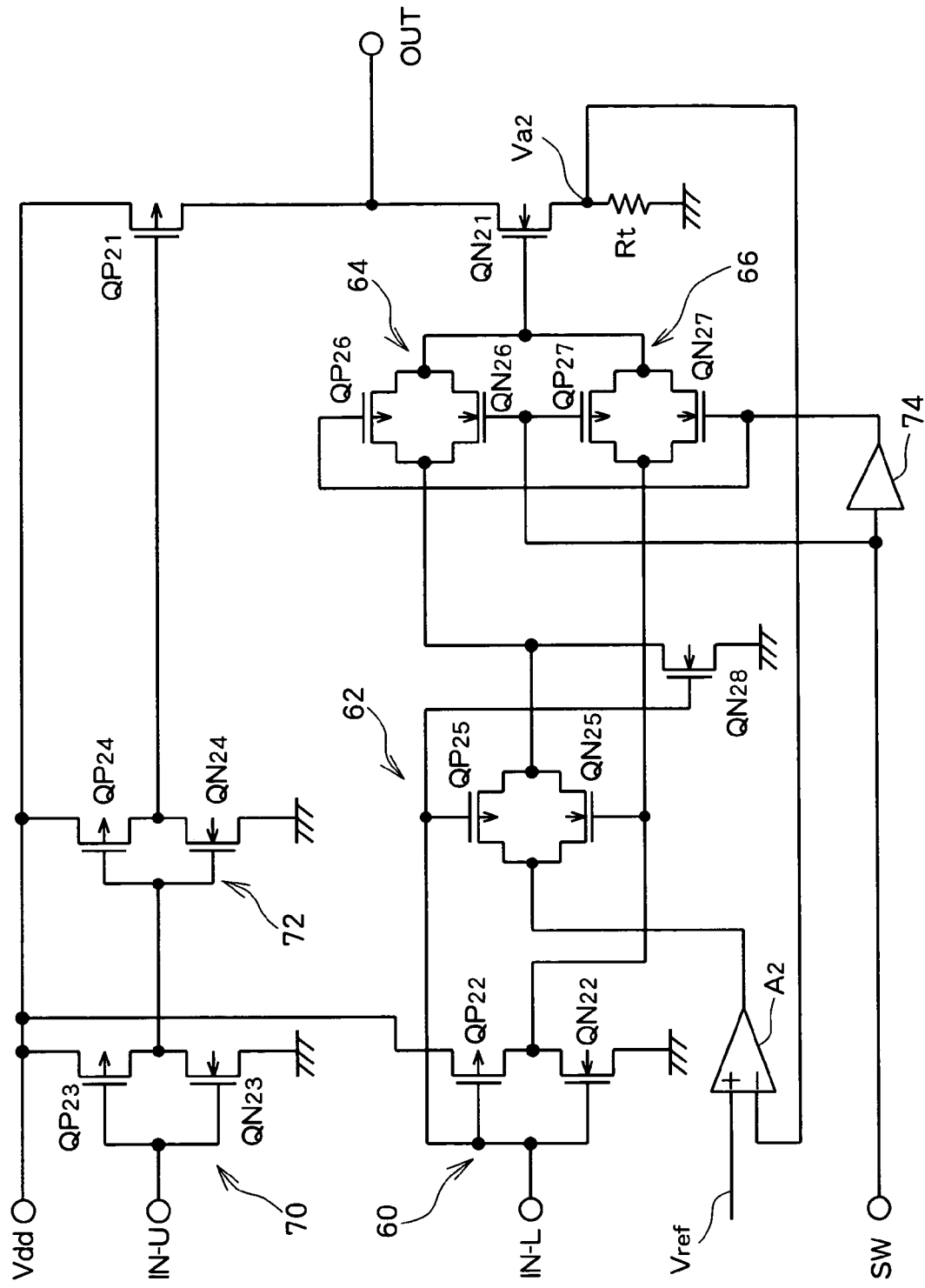
FIG. 7 is a circuit diagram showing a general configuration of a motor driver relating to a second embodiment according to the invention.

FIG. 7 is a circuit diagram showing the general configuration of a motor driver relating to the second embodiment. The motor driver shown in FIG. 7 corresponds to the motor driver 2 shown in FIG. 1 or the motor drivers 2a and 2b shown in FIG. 2 and supplies electric current from the output terminal OUT to the motor 4 to drive the motor 4. The motor driver has a configuration capable of switching between the constant current drive and the saturation drive. The motor driver has $QP_{21}$ and $QN_{21}$ at an output section thereof. A source of $QP_{21}$ is connected to Vdd, a drain thereof is connected to the output terminal OUT, and their actions are controlled by a control circuit connected to the gate. A drain of $QN_{21}$ is connected to the output terminal OUT, a source thereof is connected to the ground and their actions are controlled by a control circuit connected to the gate.

The control circuit of $QN_{21}$ is configured with an inverter 60, switches 62, 64 and 66 as well as an operational amplifier $A_2$. On the other hand, the control circuit of $QP_{21}$ is configured with inverters 70 and 72.

Each of the inverters 60, 70 and 72 is configured with a P-ch FET and an N-ch FET, a source of the P-ch FET is connected to Vdd, and a source of the N-ch FET is connected to ground. The gates of these P-ch FET and N-ch FET are connected to each other to configure an input terminal of the inverters. On the other hand, drains of the P-ch FET and N-ch FET are connected to each other to configure the output terminal of the inverters. More specifically, the inverter 60 is configured with the pair of $QP_{22}$ and $QN_{22}$, the inverter 70 with the pair of $QP_{23}$ and $QN_{23}$ and the inverter 72 with the pair of $QP_{24}$ and $QN_{24}$.

Each of the switches 62, 64 and 66 are configured with a P-ch FET and an N-ch FET. The drains of both FETs are connected to each other and the sources of both FETs are connected to each other. For example, the drains connected to each other and the sources connected to each other are used as the input terminal of the switch and the output terminal of the switch respectively. The turning on and off of each switch is controlled by a signal applied to the gates of both FETs configuring the switch. More specifically, the switch 62 is configured with the pair of $QP_{25}$ and $QN_{25}$, the switch 64 with the pair of $QP_{26}$ and $QN_{26}$ and the switch 66 with the pair of $QP_{27}$ and $QN_{27}$.

A control circuit of $QN_{21}$ is configured with an on-off control section containing the inverter 60 to realize the saturation drive, a constant current control section containing the inverter 60 and an operational amplifier $A_2$ to realize the constant current drive and a switching section for switching between them. The switching section is configured with the switches 62, 64 and 66.

A switching signal for switching the operating state of $QN_{21}$ is input to the terminal IN-L. The inverter 60 configuring the on-off control section inverts the switching signal input to the input terminal IN-L to input it in the switch 66.

On the other hand, the reference voltage Vref is input to one input terminal of the operational amplifier $A_2$ in the constant current control section. A resistor Rt is arranged in series between the source of $QN_{21}$ and ground. The resistor Rt serves as a current detecting device for detecting the electric current Ids flowing between the drain and the source of $QN_{21}$ and generates the voltage Va2 corresponding to Ids at the connecting point of $QN_{21}$ and Rt. This voltage Va2 at the connecting point of $QN_{21}$ and Rt is input to one input terminal of the operational amplifier $A_2$. Va2 is expressed as the aforementioned equation (3), namely:

$$Va2 = Ids \cdot Rt \qquad (3)$$

The output of the operational amplifier $A_2$ is input to the switch 62.

In the switch 62, an input signal to IN-L is applied to the gate of $QP_{25}$ and an output of the inverter 60 is applied to the gate of $QN_{25}$. The switch 62 is turned on when IN-L is at the L level and, on the contrary, turned off when IN-L is at the H level. On the other hand, the switches 64 and 66 are controlled by a mode signal input to a terminal SW. This mode signal is set at the L level when a saturation drive mode is specified, and set at the H level when a constant current mode is specified. A mode signal input to the input terminal SW is directly applied to the gate of $QN_{26}$ in the switch 64, and inverted by an inverter 74 and applied to the gate of $QP_{26}$. In the switch 66, a mode signal inverted by the inverter 74 is applied to the gate of $QN_{27}$ and a mode signal is applied to the gate of $QP_{27}$ as it is. That is to say, the switches 64 and 66 act complementarily, thus either one of two switches is turned on, and another switch is turned off corresponding to the mode signal. More specifically, when the mode signal input to the terminal SW is at the L level, the switch 66 is turned on and an output of the inverter 60 configuring the on-off control section is applied to the gate of $QN_{21}$. Moreover, when the mode signal is at the H level, the switch 64 is turned on. At this time, if the switch 62 is also in an on state, an output of the operational amplifier $A_2$ configuring the constant current control section is applied to the gate of $QN_{21}$.

A control circuit of $QP_{21}$ is configured with inverters 70 and 72. A switching signal for switching an operating state of $QP_{21}$ is input to a terminal IN-U and the inverter 70 inverts the switching signal input to the input terminal IN-U and sends it out. The inverter 72 further inverts the output of the inverter 70 to apply it to the gate of $QP_{21}$.

Each control circuit for $QN_{21}$ and $QP_{21}$ is configured as mentioned above. The action of $QN_{21}$ is controlled based on the switching signal input to IN-L and the mode signal input to the terminal SW and, on the other hand, the action of $QP_{21}$ is controlled based on the switching signal input to IN-U.

When operating the motor driver using the saturation drive system, SW should be at the L level. In this condition the switches 66 and 64 are turned on and off respectively. When IN-L and IN-U are at the L and H levels respectively while keeping SW at the L level, the H level delivered by the inverter 60 is applied to the gate of $QN_{21}$ to turn on $QN_{21}$ and the H level delivered by the inverter 72 is applied to the gate of $QP_{21}$ to turn off $QP_{21}$. An output voltage Vout corresponding to the ground connected to the source of $QN_{21}$ is obtained from the output terminal OUT. In this case, although the switch 62 is turned on, an output of the operational amplifier $A_2$ does not affect the performance of $QN_{21}$ because the downstream switch 64 is turned off. Here it is possible to make the output voltage Vout be a voltage close to a ground potential. In principle, however, the voltage becomes higher than the ground potential, with the voltage Ir·Rt corresponding to the current Ir flowing through the resistor Rt. In a saturation drive, it is sometimes preferable to make Vout closer to the ground potential. In this case, it is possible to provide a parallel switch to Rt, configure the switch so as to be turned on when SW is at the L level and short-circuit the source of $QN_{21}$ and the ground in the saturation drive mode.

When IN-L and IN-U are at the H and L levels respectively while keeping SW at the L level, the L level delivered by the inverter 60 is applied to the gate of $QN_{21}$ to turn off $QN_{21}$ and the L level delivered by the inverter 72 is applied to the gate of $QP_{21}$ to turn on $QP_{21}$. An output voltage Vout corresponding to Vdd connected to the source of $QP_{21}$ is obtained from the output terminal OUT. Therefore, the saturation drive enables the generation of a pulse with a height corresponding to the voltage difference between the power supply Vdd supplied to the motor driver and ground by switching between IN-U and IN-L.

When operating the motor driver in a constant current drive, SW should be at the H level. When IN-L and IN-U are at the L and H levels respectively while keeping SW at the H level, the switches 62 and 64 are turned on and the switch 66 is turned off. An output of the operational amplifier $A_2$ is applied to the gate of $QN_{21}$ to turn on $QN_{21}$ and the H level delivered by the inverter 72 is applied to the gate of $QP_{21}$ to turn off $QP_{21}$. Here the operational amplifier $A_2$ controls the conduction state of $QN_{21}$ so that the voltage Va2 input to one input terminal is equal to the reference voltage Vref input to the other input terminal. As a result, the output current Iout in this condition is set to a constant current in proportion to Vref as expressed by the aforementioned equation (4), namely:

$$Iout = Vref/Rt \qquad (4)$$

When IN-L and IN-U are at the H and L levels respectively while keeping SW at the H level, the gate of $QN_{28}$ receives the H level delivered to IN-L and is turned on to input the ground potential applied to the source in the switch 64. Thus the ground potential delivered by the switch 64, namely the L level, is applied to the gate of $QN_{21}$ to turn off $QN_{21}$. On the other hand, $QP_{21}$ is turned on and the output voltage Vout corresponding to Vdd connected to the source of $QP_{21}$ is obtained from the output terminal OUT. Additionally, since IN-L is at the H level, the switch 62 is in an off state and it is impossible for the output of the operational amplifier $A_2$ to make $QN_{21}$ be in a conduction state.

In the above-mentioned configuration, although the switches 62 and 64 are arranged between the output terminal of the operational amplifier $A_2$ and the gate of $QN_{21}$ in series, it is possible to configure without using switch 62. In this configuration, when turning on $QP_{21}$, SW is set at the L level in addition to setting IN-L and IN-U at the H and L levels respectively. Since the switch 64 is kept in an off state, this prevents the output of the operational amplifier $A_2$ making $QN_{21}$ be in a conduction state without the switch 62.

As described above, the first embodiment provides a motor driver capable of switching between the saturation drive and the constant voltage drive, while the second embodiment provides a motor driver capable of switching between the saturation drive and the constant current drive. Furthermore, according to this invention, it is possible to configure a motor driver capable of switching among three systems, namely the saturation drive, the constant voltage drive and the constant current drive. For example, a motor driver capable of switching among three systems can be realized by adopting a configuration where the control circuit of $QP_{11}$ in the first embodiment is substituted for the control circuit of $QP_{21}$ in the second embodiment.

A motor drive circuit described in the first embodiment according to the invention comprises an output unit that has a first drive transistor for controlling continuity between a first power supply and a drive output terminal and a second drive transistor for controlling continuity between a second power supply and the drive output terminal and performs power supply from the drive output terminal to a motor according to conditions of the first drive transistor and the second drive transistor, a first control unit that turns on and off the first drive transistor according to a first switching signal and delivers voltage corresponding to the first power supply from the drive output terminal in a conduction state of the first drive transistor and a second control unit that controls action of the second drive transistor according to a second switching signal and a mode signal.

The aforementioned second control unit comprises an on-off control section that selectively delivers on-voltage for making the second drive transistor be in a conduction state and off-voltage for making it be in a cut-off state according to the second switching signal, a constant voltage control section that generates a conduction control signal to be input to a control terminal of the second drive transistor based on the voltage of the drive output terminal set at a required target voltage and a switching section that selects either the on-voltage delivered by the on-off control unit or the output from the constant voltage control section to deliver the output to the second drive transistor as the conduction control signal corresponding to the mode signal when making the second drive transistor be in the conduction state.

The switching section selects the on-voltage of the on-off control section as the conduction control signal to deliver voltage corresponding to the second power supply from the drive output terminal when the mode signal corresponds to a saturation output mode and selects the output of the constant voltage control section as the conduction control signal to set the voltage of the drive output terminal at the target voltage when the mode signal corresponds to a constant voltage output mode.

The aforementioned constant voltage control section can be configured so as to have an operational amplifier in which the reference voltage is input to one input terminal, the drive output terminal is connected to the other input terminal and the output terminal is connected to the control terminal of the second drive transistor through the switching section to set the target voltage corresponding to the reference voltage. The first embodiment adopts this configuration and $A_1$ corresponds to the operational amplifier of this configuration.

The aforementioned switching section can be configured so as to have the first switch arranged between the on-off control section and the control terminal and the second switch arranged between the constant voltage control section and the control terminal to enable the first and second switches to be complementarily switched between the on and off states corresponding to the mode signal. The first embodiment adopts this configuration and the switches 48 and 46 correspond to the first and second switches respectively.

A motor drive circuit described in the second embodiment according to the invention comprises an output unit that has a first drive transistor for controlling continuity between a first power supply and a drive output terminal and a second drive transistor for controlling continuity between a second power supply and the drive output terminal and performs power supply from the drive output terminal to a motor corresponding to conditions of the first drive transistor and the second drive transistor, a first control unit that turns on and off the first drive transistor corresponding to a first switching signal and delivers voltage corresponding to the first power supply from the drive output terminal in a conduction state of the first drive transistor and a second control unit that controls action of the second drive transistor corresponding to a second switching signal and a mode signal.

The aforementioned second control unit comprises an on-off control section that selectively delivers on-voltage for making the second drive transistor be in a conduction state and off-voltage for making it in a cut-off state corresponding to the second switching signal, a constant current control section that generates a conduction control signal to be input to a control terminal of the second drive transistor based on the electric current flowing in the drive output terminal set at a required target current and a switching section that selects either one of the on-voltage delivered by the on-off control section or an output from the constant current control section to deliver the output to the second drive transistor as the conduction control signal corresponding to the mode signal when making the second drive transistor be in the conduction state.

The switching section selects the on-voltage of the on-off control section as the conduction control signal to deliver voltage corresponding to the second power supply from the drive output terminal when the mode signal corresponds to a saturation output mode, and selects an output of the constant current control section as the conduction control signal to set the electric current of the drive output terminal at the target current when the mode signal corresponds to a constant current output mode.

The aforementioned constant current control section can be configured so as to have a current detection device for generating feedback voltage corresponding to the current flowing through the second transistor and an operational amplifier in which the reference voltage is input to one input terminal while the feedback voltage is input to the other input terminal, and the output terminal is connected to the control terminal of the second drive transistor through the switching section to set the target current corresponding to the reference voltage. The second embodiment adopts this configuration, while the resistor Rt corresponds to the current detection device and $A_2$ corresponds to the operational amplifier of this configuration.

The aforementioned switching section can be configured so as to have the first switch arranged between the on-off control section and the control terminal and the second switch arranged between the constant current control section and the control terminal, in which the first and second switches are complementarily switched between the on and off states corresponding to the mode signal. The second embodiment adopts this configuration and the switches 66 and 64 correspond to the first and second switches respectively.

According to the invention, an on-off control section realizing the control of the saturation drive system to control at least one of the two drive transistors in an output unit and a constant voltage control section realizing the control of the constant voltage drive system or a constant current control section realizing the control of the constant current drive system are provided. Selection from them through a switching section enables the realization of different drive systems and restricts increase in circuit size while commonly using the output unit configured with comparatively large transistors. In addition, since the saturation drive system can be realized without depending on feedback control, high control responsiveness is secured to appropriately perform operations at high frequencies such as switching operations by PWM control.

What is claimed is:

1. A motor drive circuit comprising an output unit that has a first drive transistor for controlling continuity between a first power supply and a drive output terminal and a second drive transistor for controlling continuity between a second power supply and said drive output terminal and performs power supply from said drive output terminal to a motor according to conditions of said first drive transistor and said second drive transistor, a first control unit that turns on and off said first drive transistor corresponding to a first switching signal and delivers voltage corresponding to said first power supply from said drive output terminal when said first drive transistor is in a conduction state and a second control unit that controls the action of said second drive transistor corresponding to a second switching signal and a mode signal, wherein said second control unit comprises an on-off control section that selectively delivers on-voltage for making said second drive transistor be in a conduction state and off-voltage for making it to be in a cut-off state according to said second switching signal, a constant voltage control section that generates a conduction control signal to be input to a control terminal of said second drive transistor based on the voltage of said drive output terminal set at a required target voltage and a switching section that selects either said on-voltage delivered by said on-off control unit or the output from said constant voltage control section to deliver said output to said second drive transistor as said conduction control signal corresponding to said mode signal when making said second drive transistor be in said conduction state and said switching section selects said on-voltage of said on-off control section as said conduction control signal to deliver voltage corresponding to said second power supply from said drive output terminal when said mode signal corresponds to a saturation output mode and selects the output of said constant voltage control section as said conduction control signal to set said voltage of said drive output terminal at said target voltage when said mode signal corresponds to a constant voltage output mode.

2. A motor drive circuit corresponding to claim 1, wherein said constant voltage control section has an operational amplifier in which a reference voltage is input to one input terminal, said drive output terminal is connected to the other input terminal and the output terminal is connected to said control terminal of said second drive transistor through said switching section to set said target voltage corresponding to said reference voltage.

3. A motor drive circuit corresponding to claim 1, wherein said switching section can be configured so as to have a first switch arranged between said on-off control section and said control terminal and a second switch arranged between said constant voltage control section and said control terminal to enable said first and second switches to be complementarily switched between said on and off states corresponding to said mode signal.

4. A motor drive circuit comprising an output unit that has a first drive transistor for controlling continuity between a first power supply and a drive output terminal and a second drive transistor for controlling continuity between a second power supply and said drive output terminal and performs power supply from said drive output terminal to a motor according to conditions of said first drive transistor and said second drive transistor, a first control unit that turns on and off said first drive transistor corresponding to a first switching signal and delivers voltage corresponding to said first power supply from said drive output terminal when said first drive transistor is in a conduction state and a second control unit that controls the action of said second drive transistor corresponding to a second switching signal and a mode signal, wherein said second control unit comprises an on-off control section that selectively delivers on-voltage for making said second drive transistor be in a conduction state and off-voltage for making it be in a cut-off state corresponding to said second switching signal, a constant current control section that generates a conduction control signal to be input to a control terminal of said second drive transistor based on the voltage of electric current flowing in said drive output terminal set at a required target current and a switching section that selects either said on-voltage delivered by said on-off control section or the output from said constant current control section to deliver said output to said second drive transistor as said conduction control signal corresponding to said mode signal when making said second drive transistor be in said conduction state and said switching section selects said on-voltage of said on-off control section as said conduction control signal to deliver voltage corresponding to said second power supply from said drive output terminal when said mode signal corresponds to a saturation output mode and selects the output of said constant current control section as said conduction control signal to set the current flowing in said drive output terminal at said target current when said mode signal corresponds to a constant current output mode.

5. A motor drive circuit corresponding to claim 4, wherein said constant current control section has a current detection device for generating feedback voltage corresponding to said current flowing through said second transistor and an operational amplifier in which a reference voltage is input to one input terminal, said feedback voltage is input to another input terminal and the output terminal is connected to said control terminal of said second drive transistor through said switching section to set said target current corresponding to said reference voltage.

6. A motor drive circuit corresponding to claim 4, wherein said switching section has the first switch arranged between the on-off control section and the control terminal and the second switch arranged between the constant current control section and the control terminal, in which the first and second switches are complementarily switched between the on and off states corresponding to the mode signal.

* * * * *